United States Patent [19]

Epler et al.

[11] Patent Number: 4,771,010

[45] Date of Patent: Sep. 13, 1988

[54] ENERGY BEAM INDUCED LAYER DISORDERING (EBILD)

[75] Inventors: John E. Epler, Sunnyvale, Calif.; Robert D. Burnham, Wheaton, Ill.

[73] Assignee: Xerox Corporation, Stamford, Conn.

[21] Appl. No.: 933,666

[22] Filed: Nov. 21, 1986

[51] Int. Cl.$^4$ .................. H01L 21/265; H01L 21/263
[52] U.S. Cl. ........................................ 437/19; 437/17; 437/22; 437/24; 437/128; 437/129; 437/133; 437/936
[58] Field of Search .................. 437/19, 17, 22, 24, 437/128, 129, 133, 936

[56] References Cited

U.S. PATENT DOCUMENTS

| | | | |
|---|---|---|---|
| 4,151,008 | 4/1979 | Kirkpatrick | 148/1.5 |
| 4,159,414 | 6/1979 | Suh et al. | 219/121 LM |
| 4,181,538 | 1/1980 | Narayan et al. | 148/1.5 |
| 4,318,752 | 3/1982 | Tien | 148/1.5 |
| 4,330,363 | 5/1982 | Biegesen et al. | 156/620 |
| 4,334,139 | 6/1982 | Wittekoek et al. | 219/121 EW |
| 4,340,617 | 7/1982 | Deutsch et al. | 427/53.1 |
| 4,378,255 | 3/1983 | Holonyak, Jr. | 148/1.5 |
| 4,388,145 | 6/1983 | Hawkins et al. | 156/617 R |
| 4,505,949 | 3/1985 | Jelks | 427/38 |
| 4,511,408 | 4/1985 | Holonyak, Jr. | 148/1.5 |
| 4,542,580 | 9/1985 | Delivorias | 29/590 |
| 4,578,215 | 3/1986 | Gossard et al. | 29/569 L |
| 4,585,299 | 4/1986 | Strain | 29/576 B |
| 4,606,932 | 8/1986 | Oprysko et al. | 427/53.1 |
| 4,639,275 | 1/1987 | Holonyak, Jr. | 148/1.5 |
| 4,654,090 | 3/1987 | Burnham et al. | 148/1.5 |
| 4,668,306 | 5/1987 | Nishizawa | 148/1.5 |
| 4,671,830 | 6/1987 | Burnham | 29/569 L |

OTHER PUBLICATIONS

Meehan et al, Appl. Phys. Letts., 48 (1986), 861.
Greiner et al, Appl. Phys. Letts., 44 (1984), 750.
F. E. Harper et al, "Properties of Si Diodes Prepared by Alloying Al into n–Type Si with Heat Pulses from a Hd:YAG Laser", Solid-State Electronics, vol. 13, pp. 1103–1109, Pregamon Press, 1970.
W. D. Laidig et al., "Disorder of an AlAs–GaAs Superlattice by Impurity Diffusion", Applied Physics Letters, vol. 38(10), pp. 776–778, May 15, 1981.
J. J. Coleman et al., "Disorder of an AlAs–GaAs Superlattice by Silicon Implantation", Applied Physics Letters, vol. 40(10), pp. 904–906, May 15, 1982.
Robert L. Thornton et al., "Optoelectronic Device Structures Fabricated by Impurity Induced Disordering", Journal of Crystal Growth, vol. 77, pp. 612–628, 1986.

(List continued on next page.)

[57] ABSTRACT

A novel energy beam induced layer disordering (EBILD) process is used to (a) locally melt in a scanned pattern regions of a solid state semiconductor heterostructure to produce an alloy of intermediate composition having different optical properties and/or (b) incorporating significantly large amounts of an impurity, present in an encapsulation surface layer of a solid state semiconductor heterostructure, into regions of the heterostructure via absorption of the impurity into liquid alloy melt to form regions having different optical and-/or electrical properties and (c) thereafter optionally applying IID to enlarge or extend the disordered/as-grown boundaries of the initially melted region. As a direct write analogue to surface initiated impurity induced disordering (IID), EBILD is a flexible and viable process with high importance for continuous reproducibility and high yield in the fabrication of optoelectronic devices and thin film electronic and optoelectronic circuitry. Characterized in its simplest terms, the method of impurity incorporation contemplated by this invention provides such incorporation from a solid phase impurity source using an energy beam liquid phase technique to bring about absorption of the impurity with underlying constituents in a desired pattern to produce regions that may be disordered and possess different electrical properties or optical properties or both compared to regions not part of the scanned pattern.

58 Claims, 11 Drawing Sheets

OTHER PUBLICATIONS

L. D. Laude, "Laser Induced Synthesis of Compound Semiconductors", *Material Research Symposium Proceedings*, vol. 23, pp. 611–620 (1984).

D. J. Ehrlick et al., "Direct Writing of Regions of High Doping on Semiconductors by UV-Laser Photodeposition", *Applied Physics Letters*, vol. 36(11), pp. 916–918, Jun. 1, 1980.

D. J. Ehrlick et al., "Summary Abstract: Photodeposition of Metal Films with Ultraviolet Laser Light", *Journal of Vacuum Science Technology*, vol. 20(3), pp. 738–739, Mar., 1982.

Irving P. Herman et al., "Wafer-Scale Laser Lithography: I. Pyrolytic Deposition of Metal Microstructures", *Materials Research Society Symposia Proceedings* Re: Laser Diagnostics and Photochemical Processing for Semiconductor Devices, vol. 17, pp. 9–18, 1983.

G. A. Kachurin et al, "Annealing of Implanted Layers by a Scanning Laser Beam", *Soviet Physics Semiconductor*, vol. 10(10), pp. 1128–1130, Oct., 1976.

E. I. Shtyrkov et al, "Local Laser Annealing of Implantation Doped Semiconductor Layers", *Soviet Physics Semiconductor*, vol. 9(10), pp. 1309–1310, 1976.

G. A. Kachurin et al, "Diffusion of Impurities as a Result of Laser Annealing of Implanted Layers", *Soviet Physics Semiconductor*, vol. 11(3), pp. 350–352, Mar., 1977.

K. Ishida et al, "Fabrication of Index-Guided AlGaAs MQW Lasers by Selective Disordering Using Be Focused Ion Beam Implantation", *Japanese Journal of Applied Physics*, vol. 25(9), pp. L783–L785, Sep., 1986.

J. E. Epler et al, "Laser Induced Disordering of GaAs-AlGaAs Superlattice and Incorporation of Si Impurity", *Applied Physics Letters*, vol. 49(21), pp. 1447–1449, Nov. 24, 1986.

*Primary Examiner*—Upendra Roy
*Attorney, Agent, or Firm*—W. Douglas Carothers, Jr.

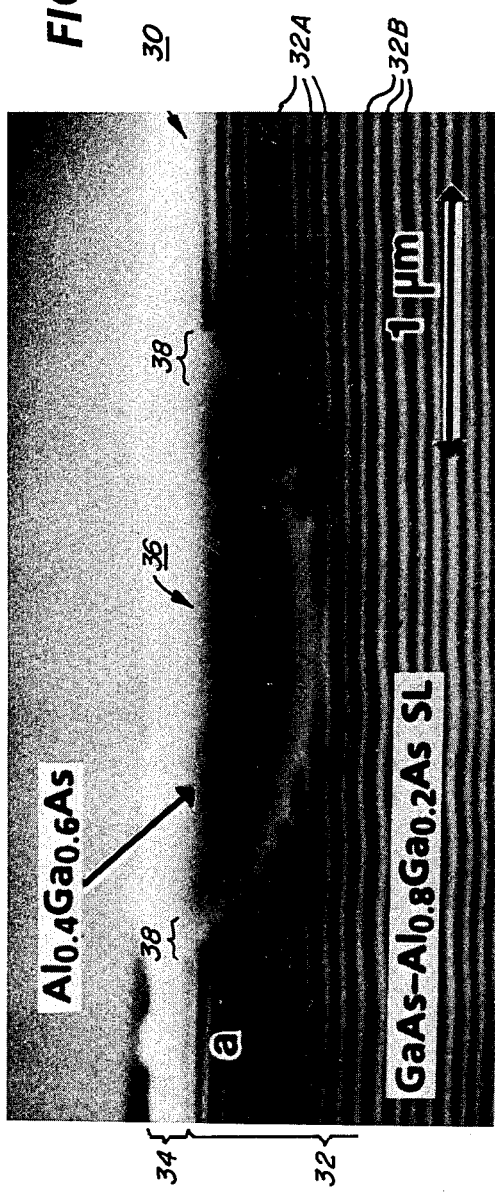
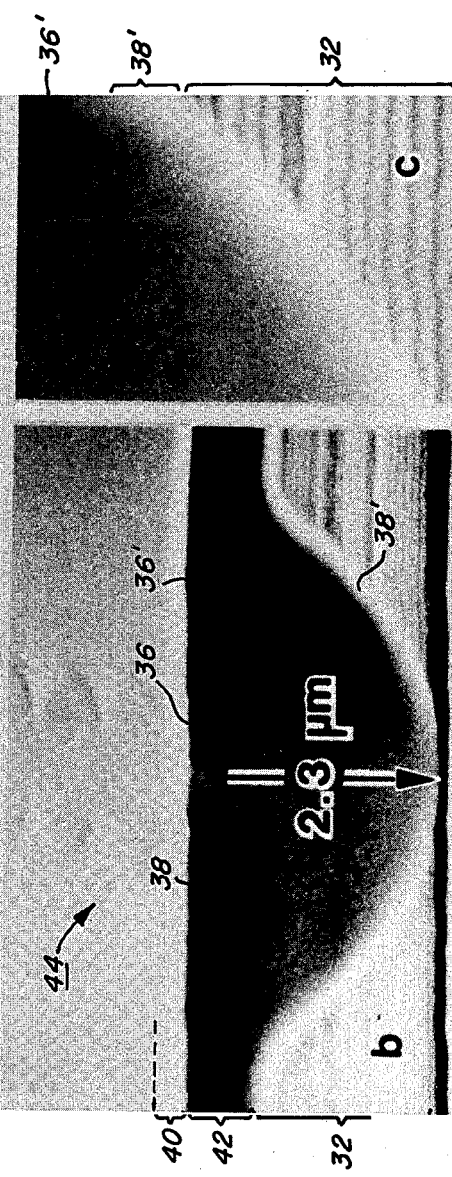
FIG. 5a
FIG. 5b
FIG. 5c

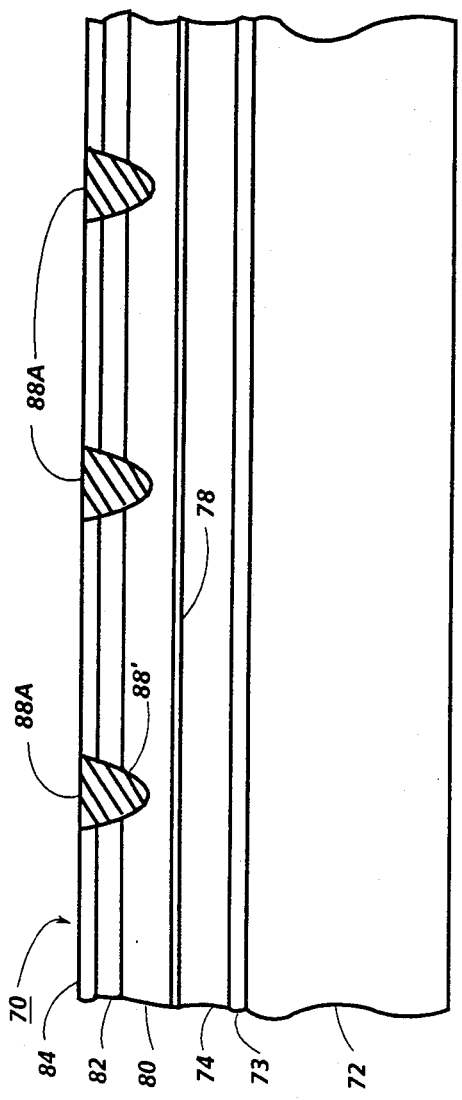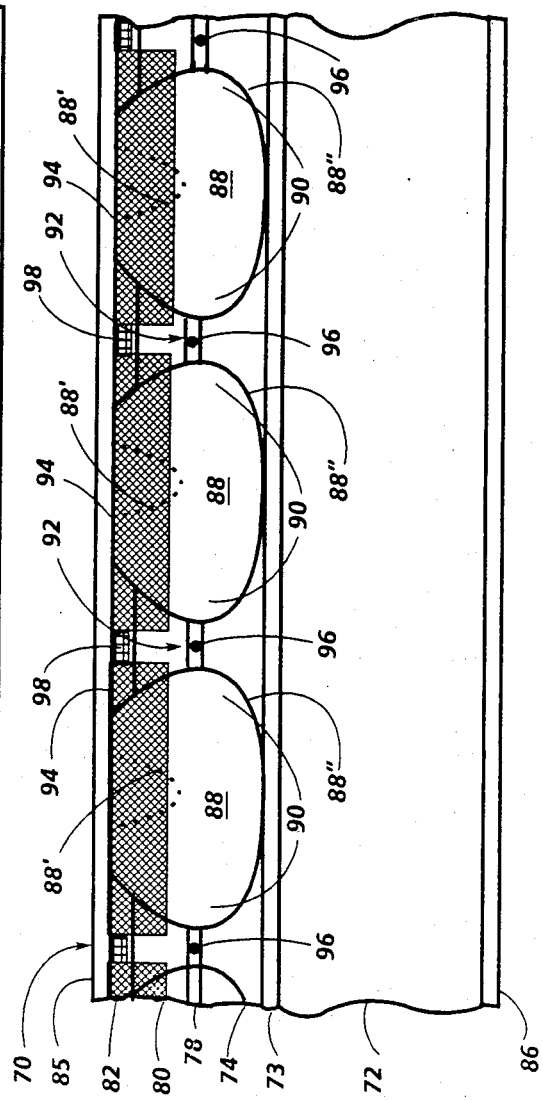

ENERGY BEAM INDUCED LAYER DISORDERING (EBILD)

BACKGROUND OF THE INVENTION

This invention generally relates to energy beam induced layer disordering (EBILD) and more particularly to the use of a direct write energy beam to selectively melt regions in a semiconductor heterostructure to produce a pattern of substantially homogeneous alloy useful for device fabrication.

Compound semiconductor samples intended for device fabrication are grown in the form of a single crystal comprised of two or more heterogeneous layers of different alloy composition, thickness and impurity concentration and/or type. By varying these crystal parameters, the electrical and optical properties of the crystal layers determine the device structure in the direction perpendicular to the plane of the as-grown layers. Further, these modifications must be selectively applied parallel to the plane of the as-grown layers with an appropriate pattern of micron resolution. Typically, conventional photolithographic techniques have been extensively employed to effect such lateral modifications. As an example, photolithographically patterning zinc or silicon or GaAlAs is followed by surface initiated inpurity induced disordering (IID) via high temperature diffusion of an impurity that causes layer disordering. See W.D. Laidig et al, "Disorder of an AlAs-GaAs Superlattice by Impurity Diffusion", *Applied Physics Letters*, Vol. 38(10), pp. 776–778, May 15, 1981 and U.S. Pat. No. 4,378,255 (zinc diffusion), and J. J. Coleman et al, "Disorder of an AlAs-GaAs Superlattice By Silicon Implantation", *Applied Physics Letters*, Vol. 40(10), pp. 904–906, May 15, 1982 and U.S. Pat. No. 4,511,408 (silicon ion implantation or silicon diffusion). IID is a process wherein an impurity, e.g. Si, is thermally diffused through two or more heterostructure layers of a sample, such as GaAlAs multilayers, disordering the isoelectronic constituents of the layers, for example Ga-Al interdiffusion of the AaAlAs layers, so that a new homogeneous alloy is formed in regions of the layers subjected to the diffusion treatment. The details of the disordering mechanism are not fully understood at this time, e.g. why the Si impurity causes an interdiffusion of elements to rapidly occur. Patterning is accomplished by the use of masking techniques so that diffusion is carried out in selected regions exposed to the impurity during the diffusion process. The disordering impurity may also be ion implanted through a mask wherein the ions implanted are a species of the ion beam. This process is followed by annealing to bring about disordering of the heterostructure layers in the regions of implant as well as anneal out the damage that occurs which is not always possible. In either case, the disordering is carried out under temperatures that are below that required for ordinary significant Al-Ga interdiffusion without the diffused or implanted impurity.

Thus, IID provides a patternable process for locally mixing alloy semiconductor layers without compromising crystal quality. The migration of the implanted or diffused impurity via thermal anneal causes traverse (traverse to the parallel extent of the as-grown crystal layers) modification to the bandgap, wavelength or refractive index of the heterostructure regions of a sample subjected to the treatment. IID has been used successfully in fabricating low threshold buried heterostructure (BH) lasers and is capable of fabricating other optoelectronic devices such as optical waveguides. In this connection, see the article of Robert L. Thornton et al, "Optoelectronic Device Structures Fabricated by Impurity Induced Disordering", *Journal of Crystal Growth*, Vol. 77, pp. 612–628, 1986. We refer to this IID process as "surface initiated IID" since, in the practice of the process, the impurity is diffused into the surface of the sample.

A problem in the application of surface initiated IID, however, is that the depth or lateral extension or width of the disordered region is not easily predictable or determinable relative to the length of time for diffusion or anneal. Further, the employment of surface initiated IID as taught by these references requires the use of masking and the generation of masks, which is a time consuming and expensive intermediate step and is dimensionally limited by the mask generation capability or facilities employed.

A direct write energy beam technique would be more efficient and useful because it has the advantage that complex patterns could be computer generated and the beam selectively applied to regions of the semiconductor structure during epitaxial growth or device preparation followed by device testing without the need of an intermediate step of mask generation. Also, with a direct write system, a commercially available low power cw beam provides a sufficiently high energy density for melting the crystal structure without significant accompanying damage to the crystal. Also, there is no problem of improper pattern registration since the beam is indexed relative to the sample via highly accurate computer control. Further, as described below, a direct write technique can be directly applied to effect immediate change to the semiconductor crystal to a practical dapth of about 1.5 $\mu$m.

This is not to say that that research and development efforts in the art have not been accomplished relative to beam assisted direct writing techniques. For example, U.S. Pat. No. 4,159,414 discloses a method to provide laser induced changes in a previously deposited compound by reducing the compound wherein selected regions of the deposited compound are reduced to an elemental state, e.g. a metal. Also, in the article of L. D. Laude, "Laser Induced Synthesis of Compound Semiconductors", *Material Research Symposium Proceedings*, Vol. 23, pp. 611–620 (1984), the constituents of compounds, such as, AlSb, AlAs, CdTe, CdSe, ZnTe, ZnSe and GeSe$_2$, are, first, independently evaporated onto a glass substrate as separate thin amorphous films and then subjected to a laser beam to transform them, via what its believed to be a solid phase process, i.e. no melting is occurring, into a crystalline compound. The process involves the local formation of an alloy per se and not the local modification of an alloy in a system.

Another area of beam assisted direct write technique has been the use of laser source energy in photolysis and pyrolysis to effect deposition of a material form its gaseous phase onto a substrate surface. In the case of photolysis, a gaseous compound of the material to be deposited is introduced into a chamber above the surface of a substrate and a laser source of energy is used to decompose the gaseous compound. The compound absorbs a portion of the incident laser energy at the selected wavelength causing photo decomposition of the compound close to the surface of the substrate and releasing a constituent of the compound for deposition on the substrate surface. As examples, see Pat. Nos. 4,606,932 and 4,340,617, and the work of D. J. Ehrlich et al at Lincoln Laboratory at MIT, e.g. D.J. Ehrlich et al, "Direct Writing of Regions of High Doping On Semiconductors By UV-Laser Photodeposition", *Applied Physics Letters*, Vol. 36(11), pp. 916-918, June 1, 1980 and D. J. Ehrlich et al, "Summary Abstract: Photodeposition of Metal Films With Ultraviolet Laser Light", *Journal of Vacuum Science Technology*, Vol. 20(3), pp. 738-739, March, 1982. In the case of pyrolysis, the gaseous compound decomposition is assisted by heating the substrate surface. As examples, see Irving P. Herman et al, Materials Research Society Symposia Proceedings, Re: Laser Diagnostics and Photochemical Processing For Semiconductor Devices, Volume 17, pp. 9-18(1983). A combination of photolysis and pyrolysis is taught in U.S. Pat. No. 4,505,949.

Another class of beam assisted direct write techniques is laser annealing to remelt an amorphous or polycrystalline material, such as amorphous silicon or amorphous GaAs, and convert such material into a single crystal material. See, for example U.S. Pat. Nos. 4,330,363 and 4,388,145.

A further class of beam assisted direct write techniques is laser annealing for the restoration of crystal structure which has been damaged by previous impurity implantation as well as for the electrical activation of the implanted impurity. See, for example, G. A. Kachurin et al, "Annealing of Implanted Layers by a Scanning Laser Beam", *Soviet Physics Semiconductor*, Vol. 10(10), pp. 1128-1130, October, 1976, and E. I Shtyrkov et al, "Local Laser Annealing of Implantation Doped Semiconductor Layers", *Soviet Physics Semiconductor*, Vol. 9(10), pp. 1309-1310, 1976 and U.S. Pat. No. 4,151,008.

Beam assisted direct write techniques have also been applied to melting doped semiconductor surface layers via laser pulsed radiation to redistribute the impurity in the layer as per U.S. Pat. Nos. 4,181,538 and 4,542,580, and G. A. Kachurin et al, "Diffusion of Impurities as a Result of Laser Annealing of Implanted Layers", *Soviet Physics Semiconductor*, Vol. 11(3), pp. 350-352, March, 1977. Also, a focused laser beam has been employed to diffuse an impurity from region of semiconductor structure into another region without melting as exemplified in U.S. Pat. No. 4,318,752.

Of course other types of energy beams have been used for beam assisted direct write techniques. Electron beam techniques are commonly used in lithography for mask generation and photoresist exposure. Ion beam techniques have been developed for maching tooling or etching or as an implantation tool as per U.S. Pat. No. 4,334,139 and K. Ishida et al, "Fabrication of Index-Guided AlGaAs MQW Lasers by Selective Disordering Using Be Focused Ion Beam Implantation", *Japanese Journal of Applied Physics*, Vol. 25(9) pp. L783-L785, September, 1986.

Thus far the successful development of energy beam assisted direct write techniques for practical accomplishment of patterned thermal disordering or impurity induced disordering relative to semiconductor heterostructures has not been accomplished.

SUMMARY OF THE INVENTION

According to this invention, the energy beam induced layer disordering (EBILD) process is used to (a) locally melt in a scanned pattern regions of a solid state semiconductor heterostructure to produce an alloy of intermediate composition having different optical properties and/or (b) incorporating significantly large amounts of an impurity, present in an encapsulation surface layer of a solid state semiconductor heterostructure, into regions of the heterostructure via absorption of the impurity into liquid alloy melt to form regions having different optical and/or electrical properties and (c) thereafter optionally applying IID to enlarge or extend the disordered/as-grown boundaries of the initially melted region.

As a direct write analogue to IID, EBILD is a flexible and viable process with high importance for continuous reproducibility and high yield in the fabrication of optoelectronic devices and thin film electronic and optoelectronic circuitry.

The method of this invention provides for selectively converting regions of a semiconductor heterostructure into a disordered alloy exhibiting different bandgap and refractive index properties by providing a semiconductor structure with at least two adjacent layers or materials that are heterogeneously dissimilar in alloy composition but of the same single crystal with regard to alloy composition and scanning the structure with an energy beam, such as a laser beam or an electron beam or an ion beam, to selectively transform at least a portion of the layers or materials into their liquid phase or state to form a disorder alloy due to interdiffusion of isoelectronic constituents wherein the new alloy comprises the averaged elemental constituents of both layers and materials without any significant crystal damage. As a result, the regions of the structure scanned by the energy beam will have a different bandgap and refractive index property compared to adjacent regions of the structure not scanned by the energy beam.

Another embodiment of the method of this invention provides for selectively incorporating impurity elements into the recrystallized regions of the semiconductor crystal by providing a semiconductor heterostructure having at least two heterogeneous layers, and forming an encapsulation surface layer or region at one of the heterogeneous layers having the encapsulated impurity as a major or sole constituent. By "major" constituent, we mean that the presence of the impurity is in such concentration levels as to form a compound or alloy of that constituent. Next, selectively melting the layer or region and portions of the underlying heterogeneous layers in a pattern to produce a disordered alloy region with a high concentration of the impurity. If desired, the disordered region formed in the heterogeneous layers can be enlarged or extended from this liquid phase disordering by subsequent thermal diffusion annealing during wherein the original disordered/as-grown boundary of the initially formed disordered alloy region will extend or migrate in a predictable manner. This further disordering via IID is isotropic or, in some cases, is anisotropic. Additionally, the impurity may be incorporated via the EBILD method of this invention for the purpose of patterning the desired regions of resistivity or conductivity in the crystal layers to provide, for example, a path of high conductivity for current flow within the crystal structure.

Also, another aspect of this invention may be employed to incorporate the impurity from an encapsulation layer into a sample wherein selected regions of the underlying sample are melted to bring about the absorption of the impurity into the melt. Such an incorporation may be into a single layer of the sample or more than one layer to bring about disordering as well as impurity incorporation by this technique.

Characterized in its simplext terms, the method of impurity incorporation contemplated by this invention provides such incorporation from a solid phase impurity source using an energy beam liquid phase technique to bring about absorption of the impurity with underlying constituents in a desired pattern to produce regions that may be disordered and possess different electrical properties or optical properties or both compared to regions not part of the scanned pattern.

In the past, laser assisted diffusion of an impurity has been tried but it was common belief that in order for successful diffusion to occur and disordering of a heterostructure region, remelt of the crystalline layers or materials involved was to be avoided, as is the case in conventional diffusion to bring about disordering as, for example, U.S. Pat. No. 4,378,255. Attempts to use such a laser assisted procedure were not successful without melting of the heterostructure and, as a result, any further work was abandoned. However, we have discovered that operating in the liquid phase or state will provide an intermixing of the impurity to induce disorder within the heterostructure elemental constituents to form a new alloy and provide a large seed point from which subsequent IID will propagate in a highly controlled manner and at a predictable propagation rate. In fact, the rate of extension of the initial melt, disordered region is greatly improved by this technique over conventional IID, rendering the use of IID techniques practical for successful semiconductor device fabrication. There are significant impediments for conventional IID to become a useful technology for modern fabrication of semiconductor devices because there is no practical way of controlling the extent of depth and lateral progression or migration of the disordering process in a semiconductor device on a continuous reproducibility basis to provide satisfactory product yields. By nature of the initial state of the incorporated impurity in a "seed" or "node" region of the heterostructure, the method of this invention provides a technique for controlling such migration in a systematic and continuous manner so that advanced determination can be readily accomplished relative to desired depth and lateral extent of enlarged or extended disordering via subsequent IID.

It should be noted that the method of this invention involves the formation of an alloy of averaged composition, from a single crystal heterogeneous sample wherein the layers form a common crystal lattice, by local melting of selected regions of the sample in a scanned beam pattern. In the case of the work of L. D. Laude, supra, separate amorphous films of elemental constituents are heated without melting to allow the formation of crystallites consisting of an alloy of the constituents to create a polycrystalline film in regions of these films scanned by the beam.

Also, one aspect of this invention involves the incorporation of an impurity into a semiconductor structure for the purpose of changing the electrical properties of the regions scanned by the beam. U.S. Pat. No. 4,542,580 relates to the incorporation of impurities. However, the same or different impurities are first deposited as amorphous films or coatings in selected regions of the sample followed by melting of the films causing diffusion of the impurity into the sample in the selected regions via annealing due to heating from the films or coating. The process of this invention differs from U.S. Pat. No. 4,542,580 in that the present invention involves (a) impurity incorporation via a scanned beam pattern directed onto an impurity encapsulation surface layer present on the sample surface and (b) the impurity, present in an encapsulation surface layer, is absorbed into the sample by melting underlying regions of the sample traced by the beam and upon recrystallizing forms a doped region wherein the impurity has been interdispersed throughout the region. U.S. Pat. No. 4,542,580 does not contemplate impurity incorporation in a scanned beam pattern or melting of the sample to induce impurity absorption.

Relative to the description of this invention, it should be understood that the term "heterostructure" means a single crystal semiconductor sample having two or more layers of different alloy or alloying composition, for example AlAs or GaAlAs on GaAs, or Si or Ge on GaAs or CdS on ZnSe, etc. Further, when using the term, "heterogeneous layer(s)", reference is being made to the heterogeneous nature of layers with respect to each other and not with respect to the composition within a layer per se. Other objects and attainments together with a fuller understanding of the invention will become apparent and appreciated by referring to the following description and claims taken in conjunction with the accompanying drawings.

BRIEF DESCRIPTION OF THE DRAWINGS

FIG. 5a is a SEM image of a cross section of a GaAs-$Ga_{1-x}Al_xAs$ supperlattice sample laser scanned in accordance with the teachings of this invention.

FIG. 5b is a SEM image of the cross section shown in FIG. 5a after IID processing in accordance with the teachings of this invention.

FIG. 5c is a magnified SEM view of a portion of FIG. 5b illustrating the sharpness of the IID transition at the disordered/as-grown boundary of the sample.

FIG. 7b is a magnified SEM view of the left side of the disordered region of the laser structure shown in FIG. 7a.

FIG. 11 is a cross sectional schematic diagram of the buried heterostructure (BH) laser having the structure shown in FIG. 10 showing the laser structure just after energy beam disordering.

FIG. 12 is a cross sectional view of the buried heterostructure (BH) laser structure of FIG. 11 after IID treatment and with current contacts and selected proton implant to complete fabrication.

DETAILED DESCRIPTION OF THE PREFERRED EMBODIMENTS

Figure 1:
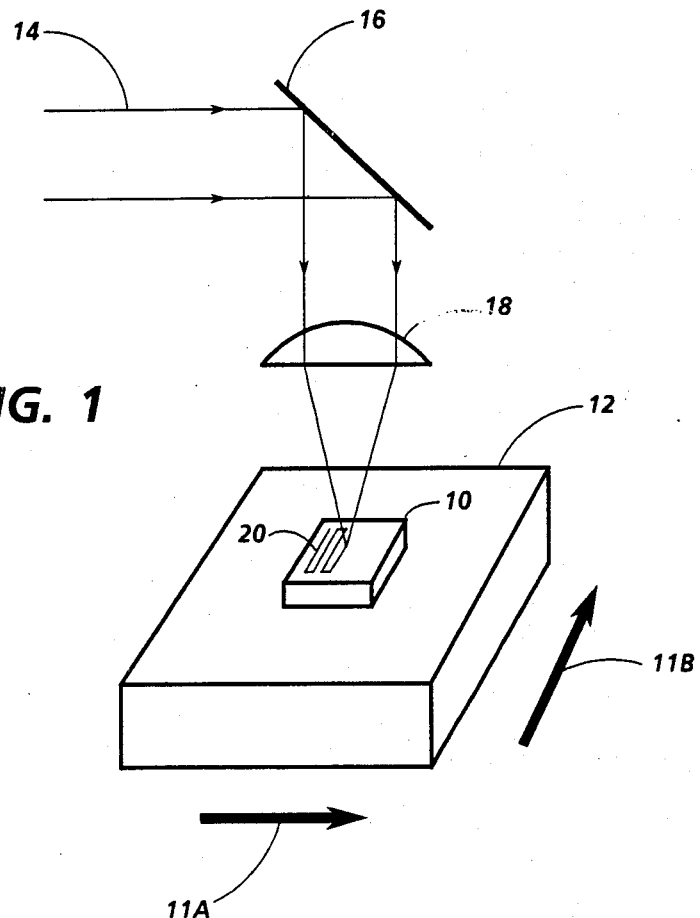
FIG. 1 is a perspective view of an X-Y computer controlled table apparatus that may be employed to practice this invention.
Figure 2:
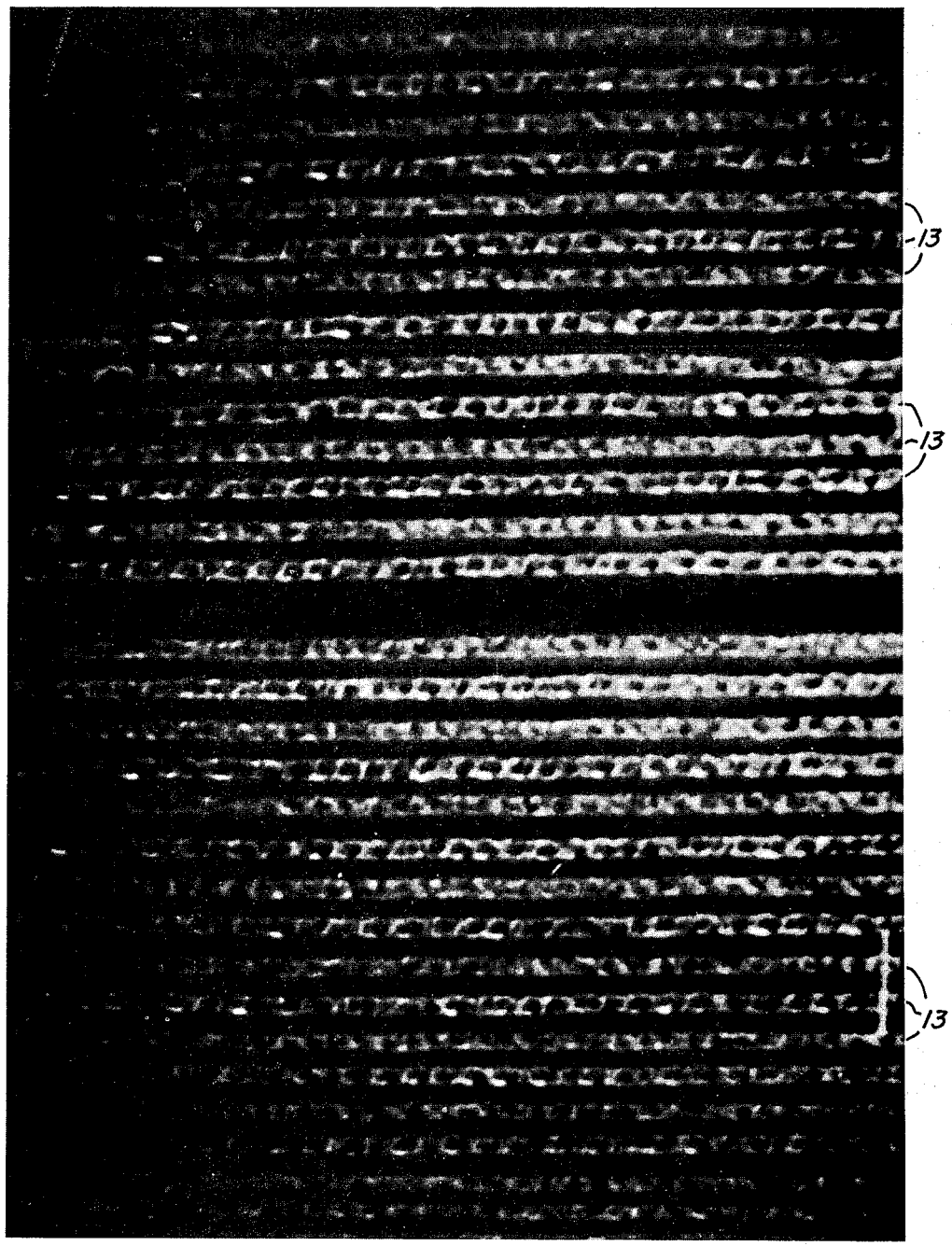
FIG. 2 is a SEM image of a plan view of a sample scanned with the apparatus of FIG. 1.

Reference is now made to FIG. 1 wherein there is shown a scanning table 12 under the control of a computer to be incrementally indexed in the X and Y directions 11A and 11B. A sample, such as heterostructure 10, is mounted on the surface of table 12 and is exposed to a stationary tightly focused laser beam 14 as table 12 is orthogonally indexed under computer control. Alternatively, for EBILD processing in a growth reactor, the sample would remain stationary in the reactor and the local spot of the laser beam would be translated in orthogonal directions under computer control. Beam 14 is typically an Ar+ laser beam and may, for example, have a wavelength of 488 nm with a power level of 300 mW providing a focused 1 $\mu$m spot size. This could include, for example, using a Kr+ laser having a wavelength of 649 nm to melt buried crystal layers below a transparent surface layer of the sample. The wavelength of laser beam 14 is chosen to be in the spectra from ultraviolet to far infrared as long as it is an energy level above the energy bandgap of the sample crystal to be processed. Beam 14 is folded by mirror 16 and focused onto sample 10 by means of spherical lens 18. The indexing rate of table 12 may be about 100 $\mu$m/sec. The range of indexing rate is about 20 $\mu$m/sec to about 200 $\mu$m/sec. With a 1 $\mu$m spot size, 200 $\mu$m/sec is about the maximum rate of indexing without raising the temperature of sample 10. The power level, scanning speed, and spot size of beam 14 are adjusted to induce crystal melting at the sample surface on a micron scale. As sample 10 is moved relative to beam 14, transient melting of sample 10 occurs along the scan trace of the laser beam spot on the sample as illustrated at 20 in FIG. 1. FIG. 2 is a SEM photograph of the scan pattern on a sample 10 providing a transient melt trace pattern of scan lines 13 on 8 $\mu$m centers.

While an energy beam for purposes of illustration has been chosen to be a laser beam, it is evident to those skilled in the art that other types of energy beams may be employed to provide the disordering treatment of the method of this invention. For example, an ion beam or an electron beam or acoustic beam or any local heat source that can be tightly focused and scanned and is of sufficient energy and intensity to induce melting of the sample so that it may be used for beam 14. The use of an ion beam to incorporate impurities or elements as a species of the ion beam does not function as an energy beam contemplated for the practice of this invention. In this connection, see K. Ishida et al, supra.

Sample 10 may comprise a heterostructure having, for example, at least two layers that are heterogeneous in alloy composition. An example of such a structure would be a pair of layers respectively comprising GaAs and $Ga_{1-x}Al_xAs$, or a quantum well feature comprising a single layer of GaAs or $Ga_{1-x}Al_xAs$ with adjacent hetero-cladding layers or superlattices comprising alternating layers of GaAs and AlAs or GaAs and $Ga_{1-x}Al_xAs$ or $Ga_{1-x}Al_xAs$ and $Ga_{1-y}Al_yAs$ where $x<y$. Upon application of beam 14, the regions of the layers scanned by beam 14 are rapidly converted into their liquid phase or state and the crystal layers intermix, forming a substantially homogeneous alloy comprising the constituent of both layers along the scan or trace pattern. For example, if the layers are GaAs and $Ga_{0.2}Al_{0.8}As$, the resulting alloy in the trace pattern will be homogeneous $Ga_{0.6}Al_{0.4}As$ due to the intermixing of the Ga and Al atoms in the melt trace. Thus, this is a form of transverse modification of the bandgap refractive index properties of the regions traced by the beam, which properties are different compared to regions not so traced by the beam.

Figure 3:
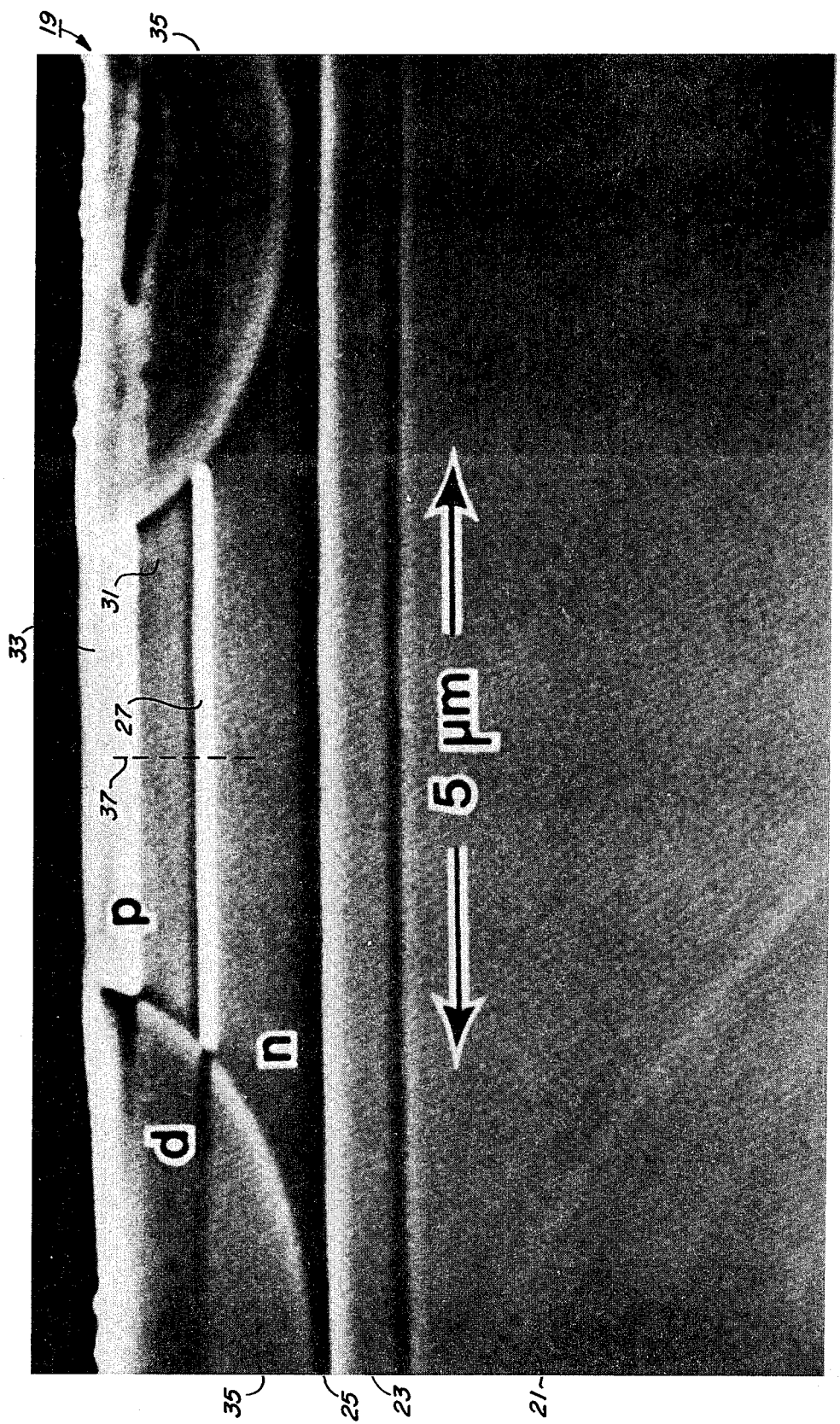
FIG. 3 is a SEM image of a cross sectional view of a buried heterostructure (BH) laser fabricated in accordance with the teachings of this invention.

Reference is made to FIG. 3 which shows a buried heterostructure (BH) laser fabricated using the EBILD process just described. BH laser 19 comprises n-GaAs substrate 21 upon which are epitaxially deposited the following layers using conventional MOCVD: n-GaAs buffer layer 23, n-$Ga_{1-x}Al_xAs$ cladding layer 25, undoped active region 27 comprising a quantum well of GaAs, p-$Ga_{1-x}Al_xAs$ cladding layer 31 and p+GaAs cap layer 33. As is well known in the art, active region 27 may also be either a single active layer not exhibiting quantum size effects or a multiple quantum well or a stair step qunatum well. After completion of the epitaxial growth of these layers, the apparatus in FIG. 1 is employed to remelt crystal regions in cap layer 33, cladding layer 31 and active region 27 forming a pair of spatially disordered alloy regions 35 in a direction out of the plane of FIG. 3. Disordered regions 35 consist of an averaged alloy of $Ga_{1-x'}Al_{x'}As$, where $x'>x$, having a wider bandgap and lower refractive index compared to the remaining waveguide region between regions 35 forming a waveguide region 37 for lasing operation upon completion of current contacts and proton implant for limiting current to the waveguide region. This two step process may be utilized also for forming patterned regions of conductivity in device structures by remelt of selected regions to incorporate an impurity therein to change the level of conductivity of the regions.

Thus, this two step EBILD process is summarized as follows: (1) the provision of a semiconductor heterostructure and (2) the application of a scanned energy beam under computer control and focused on the sample to selectively disorder regions of the sample by converting a portion of the underlying crystal structure into its liquid phase. This applied process has important advantages particularly over the use of IID per se. First, the method or process of this invention here is a direct write process, that is, semiconductor devices and structures may be created with micron precision using the scan pattern of an energy beam. Photolithographic masking techniques are not necessary. In the case of surface initiated impurity, as taught in U.S. Pat. Nos. 2,378,255 and 4,511,408 and the many publications now existing on this IID process, require initially some surface definition for exposure of the surface to an impurity for diffusion ir implant into the sample, which is not required in practicing the present invention. Secondly, by varying the laser power (W/cm$^2$) or the rate of scanning or the beam spot size or a combination thereof, the depth of the disordered/as-grown boundary can be controlled. Third, a very sharp transition at the disordered/as-grown boundary occurs, such as 20 nm wide, as compared to IID processing per se and as compared to the state of the art BH structures at the active region boundary wherein the boundary is 70 to 80 nm wide. Smaller transition boundaries becomes a very important issue when dealing with narrow width active regions of 5 um or less.

In addition, if an impurity has been deposited on the surface of the sample in an encapsulation layer or within the confines of the upper region or surface layer of sample 10, the impurity will be incorporated into the crystal melt in a concentration equal to the liquid solubility of the impurity in the alloy. The liquid GaAlAs melt is proficient in decomposing the encapsulation layer and absorbing soluble species into the melt. The difficulty of transport of an impurity through a crystal interface and into the crystal structure, as in IID, is, therefore, avoided. Also, diffusion time is greatly decreased and reproducibility is enhanced over IID per se. Upon solidification, the impurity will remain in the patterned alloy in large concentrations, concentrations that intentionally exceed that for normal doping and which are equal to the solid solubility of the material. As an example of such a sample to be patterned, sample 10 may comprise GaAs-Ga$_{1-x}$Al$_x$As layers or a superlattice of GaAs-Ga$_{1-x}$Al$_x$As, initially coated with a thin film of an impurity or an impurity encapsulated surface layer, e.g. Si, SiO$_2$ or Si$_3$N$_4$ or ZnAs, and then the sample is scanned in the manner illustrated in FIG. 1. There may be more than one impurity or a combination of impurities chosen for encapsulation in the surface layer. The impurities that may be in the encapsulation surface layer for the III-V regime of compounds and alloys may be, for example, Ge, Se, Mg, O, S, Be, Te, Si, Mn, Zn, Cd, Sn, Cr or V or admixtures thereof. The impurity will be incorporated into the crystal melt in regions traced by beam 14 and the impurity will be incorporated into the crystal melt in a concentration equal to the liquid solubility of the impurity in the alloy produced by the intermixing of the heterogeneous layers therebeneath. Upon solidification, the impurity will be in large concentrations in the alloy, for example, in the case of Si, in the range of about $10^{18}$ to $10^{21}$ atoms/cm$^3$.

When regimes other than the III-V regime of compounds are contemplated, such as the II-VI regime of compounds or II-V regime of compounds, the above list of impurities may be expanded to include B, N, C, Al, P, Ga, As, In, Sb, Hg, Pb and Bi.

The use of the terms "impurity encapsulation surface layer" in the context used here means that the surface layer covering the sample or structure is a compound or element of the desired impurity in preparation for subsequent incorporation in underlying layers via liquid phase. Thus, it is the underlying structure and not the impurity that is encapsulated. The impurity encapsulation surface layer may take several forms. The impurity may be directly deposited upon the surface of the sample by either sputtering, evaporation or vapor deposition. On the other hand, the impurity, e.g. Si, may be deposited by sputtering, evaporation or vapor deposition as a compound layer, e.g. Si$_3$N$_4$, which is pyrolytically and chemically decomposed upon beam scanning. Further, the impurity may be deposited in high concentration levels in the form of clusters or spikes embodied in the upper region of the sample or top layer of the sample during the epitaxial growth of the sample, e.g. Si clusters embedded in an upper GaAs layer. Also, the impurity may be deposited as a monolayer or submonolayer or spatial multiple layers thereof in the upper region of the sample or in the top layer of the sample during the epitaxial growth of the sample. All of these examples are referred to herein as a "impurity encapsulated surface layer".

The impurity is provided in the encapsulation layer in exceedingly large amounts, that is in an amount that is overtly generous and overabundant to provide a solid phase impurity source for incorporation and subsequent disordering or conductivity change.

The presence of the impurity in such large concentrations provides several benefits. As an example, with Si incorporated into a sample 10 of GaAs-Ga$_{1-x}$Al$_x$As, an extension or migration of the disordered/as-grown boundary may be brought about by application of IID. Sample 10 may be heated at a temperature for a sufficient period of time to cause the high concentrations of the Si impurity to diffuse deeper into the sample thereby enlarging, either isotropically or anisotropically, the region of disordered alloy from the original region of crystal remelt to a depth of several microns. By control of the laser power (W/cm$^2$) or the rate of scanning speed of beam 14, the depth and lateral width of the disordered/as-grown boundary can be varied and determined as to final boundary position in the heterostructure.

Impurity incorporation in the disordered melt may also be for the purpose of forming a new alloy comprising the impurity and the constituents in the melt.

Thus, this three step process is summarized as follows: (1) the provision of a surface layer with an encapsulated impurity, (2) the application of a scanned energy beam under computer control focused on the sample to selectively disorder regions of the sample by converting a portion of the underlying crystal structure into a liquid phase, as well as incorporating large concentrations of the impurity into the region of remelt and (3) the application of IID to extend or enlarge the disordered-/as-grown boundary of the remelted and initally disordered region further into the crystal bulk of the sample. This applied process has several important advantages particularly over the use of IID per se. First, the method or process of this invention here is a direct write process, that is, semiconductor devices and structures may be created with micron precision using the scan pattern of an energy beam. Photolithographic masking techniques are not necessary. In the case of surface initiated impurity, as taught in U.S. Pat. Nos. 2,378,255 and 4,511,408 and the many publications existing on this IID process, require initially some surface definition for exposure of the surface to an impurity for diffusion or implant into the sample, which is not required in practicing the present invention.

Secondly, highly controlled disordering depths and widths are possible across the sample because the initial incorporation of a high concentration of the impurity within the crystal functions like an "infinite" source for the impurity and provides a homomorphic node or seed region for the subsequent uniform dispersal of the impurity into the sample crystal for disordered migration of the disorder/as-grown boundary. It has been found that by starting the IID process with a homogenous high concentration impurity/alloy node or seed produced by an initial melt in the sample, the extension or enlargement of this node or seed, subsequent IID processing is highly controllable as to depth and lateral propagation of desired dimensional extent than is possible with surface initiated IID as well as eliminating the difficulties encountered in the transport of impurities from an amorphous film to a solid state crystalline matrix, such as GaAs. There is a resistance to the introduction of an impurity into the crystal layers in surface initiated IID. In EBILD, the impurity is initially incorporated via remelt so that surface resistance to diffusion upon subsequent IID is not a factor or concern. This leads to shorter anneal times when employing subsequent IID.

Third, a much shortened annealing time is required for EBILD processing compared to surface initiated IID. For example, a further migration via IID of the disordered/as-grown boundary of the impurity/alloy node into the sample of an additional depth of 1 μm using the method of this invention will be approximately 1.0 hour whereas if surface initiated IID is utilized per se, the time to reach the same depth will be significantly greater, e.g. about 8 or more hours. In general, IID anneal times have required as much as 8 hours to sometimes as much as 32 hours whereas EBILD anneal times are between 0.5 to 8 hours. The shorter period of anneal translates to the probability of no significant crystal alterations or degradation compared to high temperature, prolonged anneal times of IID.

Fourth, because of the foregoing four advantages, the use of the EBILD method of this invention for full scale fabrication of semiconductor devices is possible on a continuous, reproducible basis which is not possible from a practical point of view when employing surface initiated IID.

These four advantages exist, due in large part, because of the different initial conditions existing prior to application of the step of IID processing. The impurity, to start with, has been incorporated in a large concentration into a crystal region nearly homogeneous. Also, there is more than ample presence of the impurity for subsequent disordering so that any problems that are associated with the molecular interface at the juncture of the surface layer with the top surface of the heterostructure or between subsequent heterostructure layers of the heterostructure are avoided. An example of such a problem is the reduced rate of diffusion observed with IID per se with the occasional blocking of diffusion by undoped layers present in the heterostructure.

Thus, in addition to mixing superlattice layers or other heterostructure layers, the EBILD process incorporates impurities present in the encapsulation surface layer into the regrown material. For example, the laser power level of 300 mW (equivalent to about 1300° C. at a 1 μm focused spot) is insufficient to melt Si (melting point of about 1412° C.), yet elemental Si present in an encapsulation surface layer will dissolve into the GaAlAs melt in large concentrations, for example Si approximately $10^{20}$ atoms/cm$^3$. Subsequent thermal annealing will result in IID propagating from the regrown region. Thus, the disordered/as-grown boundary may be controllably moved in a predictable manner beyond the original regrown/as-grown boundary and the EBILD process serves as a highly controlled direct write technique for patterned IID processing.

Reference is now made to the remaining Figures which illustrate the application of the method comprising this invention with reference to samples produced by the practice of the method. As will be evident to those skilled in the art, the application of this method relative to these examples is for the purposes of clarity and does not limit the invention to any particular form.

Figure 4:
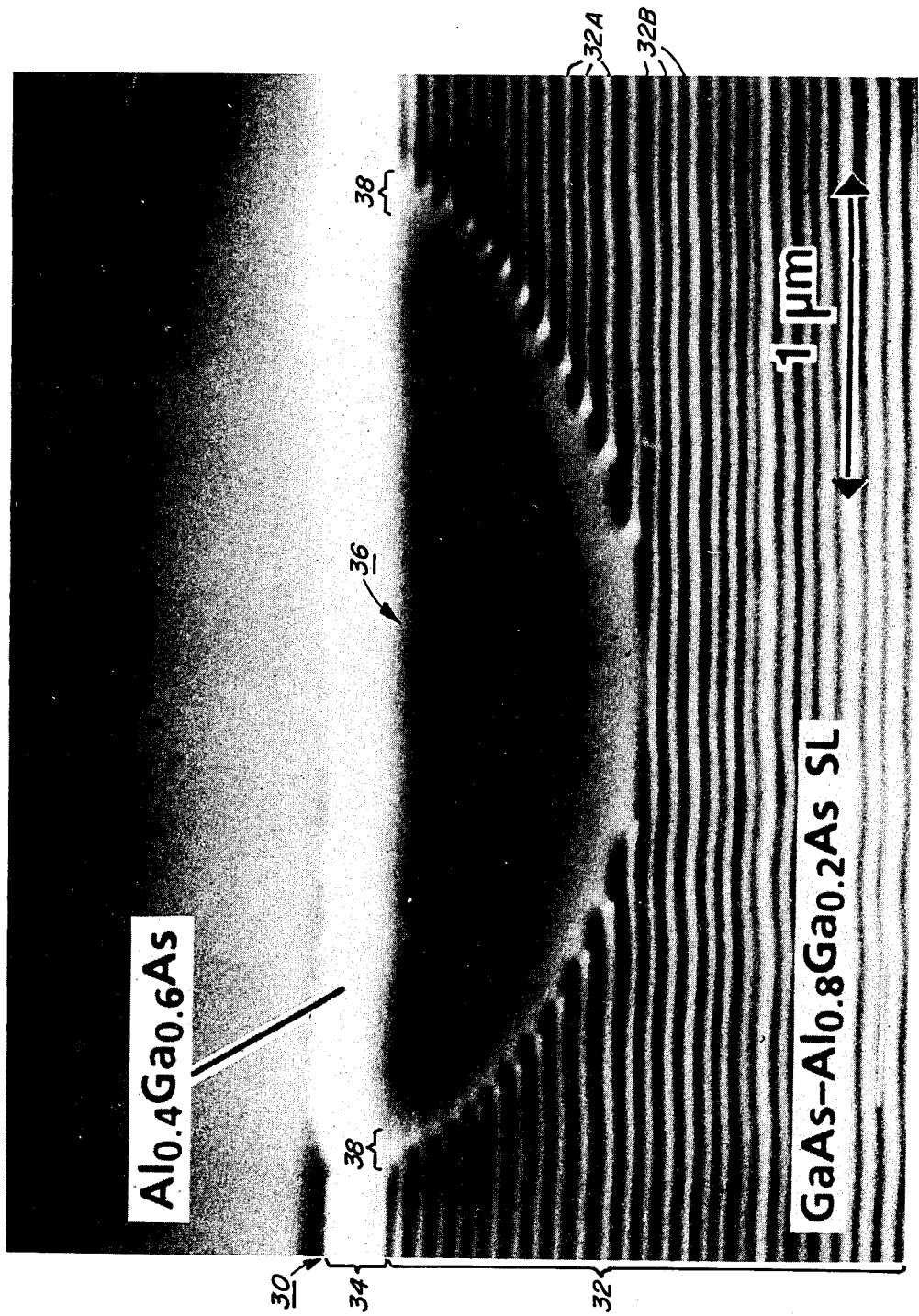
FIG. 4 is a SEM image of a cross section of a laser scanned $GaAsGa_{1-x}Al_xAs$ superlattice sample laser scanned in accordance with the teachings of this invention.

FIG. 4 shows a SEM photograph of a highly magnified cross section of the superlattice sample 30 after being scanned at 100 μm/s with a 300 mW laser beam 14 having a focused spot size of 1 μm. The as-grown superlattice 32 comprises an undoped GaAs layers 32A (the brighter lateral layers in region 32 of FIG. 4) each having a thickness of about 35 nm alternated with $Ga_{1-x}Al_xAs$ layers 32B each having a thickness of about 35 nm and wherein the cation fraction x was equal to 0.8. The bright region on top of superlattice 32 is encapsulation surface layers 34 comprising a first layer of Si evaporated on superlattice 32 and having a thickness of about 50 nm and a second cap layer of $Si_3N_4$ having a thickness of about 150 nm. In FIG. 4, the apparent waviness or nonuniformity of the superlattice layers is an artifact of the scanning electron microscope (SEM). The disordered region 36 formed by the scanned beam is 3 μm wide and comprises recrystallized $Ga_{1-x'}Al_{x'}As$ where the molar fraction x' is now approximately 0.4 formed in the wake of scanned energy beam 14. In the liquid phase, the crystal layers of GaAs and $Al_xGa_{1-x}As$ intermix rapidly before recrystallizing, so that the regrown region 36 appears substantially homogeneous. In regrown region 36, the faint swirling patterns, which are believed to indicate some incomplete intermixing, are only observed at high laser power levels. Since the sample shown in FIG. 4 is stained with a defect sensitive A-B etch, the smoothness of regrown region 36 demonstrates the absence of any heavy crystal damage. When damage does occur, dark pits are clearly visible, usually near the surface at the center of regrown region 36. The homogeneous crystal region 36 exhibits a very sharp transition of approximately 40 nm in width at the disordered/as-grown boundary 38.

The impurity, such as Si, can play an important role in the EBILD process. It should be noted that this type of laser scanning has an inherent instability because the reflectivity of the sample increases dramatically at the onset of melting of the crystal material. As a result, a "negative feedback" usually results, ending in an oscilatory melting pattern on the sample surface. Because the Si layer does not fully melt, it provides a more constant optical absorption level and thus dampens the formation of these oscillations. Observation of numerous scanned samples indicates a concurrent reduction in thermally induced damage in the remelted as-grown crystal. In addition, the presence of elemental Si impurity layer reduces the required laser power level for melting by approximately 40% compared to the case where no impurity capsulation layer is employed. Also, the $Si-Si_3N_4$ surface layers 34 serve as better antireflection layers for molten GaAlAs than $Si_3N_4$ per se.

Because of the absence of any surface diffusion barrier and the high Si concentration in recrystallized region 36, region 36 can serve as an excellent source for subsequent IID anneal. In FIG. 5, a SEM cross section is shown after scanning (FIG. 5a) and after a subsequent thermal anneal at 850° C. for 8 hours (FIG. 5b). The power level of the scanning laser beam was 400 mW and the scan speed was 100 μm/s. The regrown region 36 in FIG. 5a has a 0.5 μm depth and 1.0 μm halfwidth. After beam scanning, $Si-Si_3N_4$ surface layers 34 are removed in a $CF_4/O_2$ plasma and a layer of $Si_3N_4$, without the presence of any elemental Si layer, is deposited as a cap layer for subsequent IID annealing to prevent the outdiffusion of arsenic from the sample, which technique is well known in the art. After an anneal for 8 hours at 850° C., the original Si induced disordering region 36, as shown in FIG. 5b, has extended the disordered/as-grown crystal boundary 38 about 2.3 μm deeper into the crystal heterostructure to a new boundary 38′. During this anneal process, a sufficient amount of Si impurity diffused from the new Si$_3$N$_4$ cap layer 40 into the surface region of sample 30 to disorder a 1 μm deep region 42 across the entire sample. The initial regrown region 36 profile is visible in the center of region 36′ of FIG. 5b. Also shown in FIG. 5b is the oscillatory pattern 44 in the surface tracking of scanned laser beam 14 and the outline of the original disordered/as-grown boundary 38. FIG. 5c is a more magnified view of disordered/as-grown boundary 38′. The sharpness of the transition is approximately 70 nm in width which compares favorably with standard surface initiated IID. However, by varying the amount of laser power relative to the scan speed and adjusting the length of the period of subsequent IID anneal, the depth of the boundary 38′ upon subsequent IID anneal can be precisely predicted and controlled to the desired depth and lateral penetration. Further, the time period to attain a given depth of disordering is significantly shorter for EBILD when compared to IID.

Figure 6:
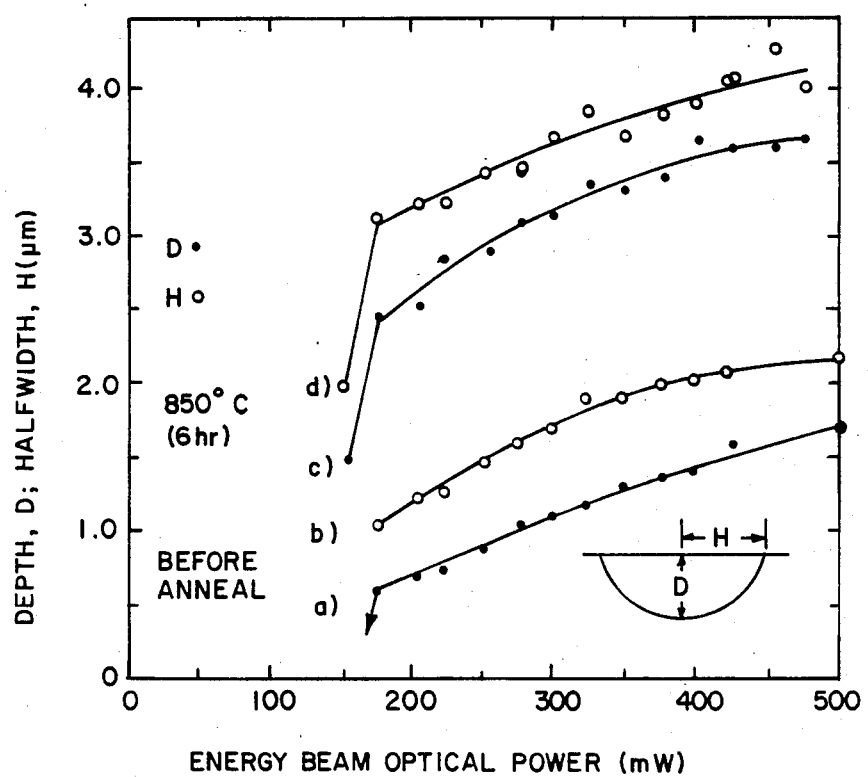
FIG. 6 is a graphic illustration of the depth (curves a, c) and halfwidth (curves a, b) of the disordered region in FIG. 5 before (curves a, b) and after (curves c, d) IID processing as a function of energy beam optical power.

In FIG. 6, the depth, D, and halfwidth, H, of disordered region 36 are measured before IID via thermal annealing, as represented by curve a (representing depth) and curve b (representing halfwidth) as a function of energy beam power. Curves c and d respectively represent the depth, D, and halfwidth, H, or disordered region 36′ measured after IID via thermal annealing as a function of energy beam power. The measurements, taken from the SEC cross sections of the measured samples, indicate the onset of melting at a laser power level of about 175 mW. As the power level is increased, the depth of melting increases linearly, with an approximate slope of 2.3 μm/W.

Thus, the depth and lateral extent of the disordered-/as-grown boundary 38′ is relatively predictable as the the amount of initially applied energy beam optical power. Of concern, however, is that increasing amounts of thermally induced damage to the crystal structure are observed for optical power levels above 400 mW.

As previously indicated, measurements indicate that the Si impurity diffusion length on IID thermal anneal is approximately 2.5 μm, corresponding to a diffusion constant of $2.0 \times 10^{-12}$ cm$^2$/sec. This value is somewhat larger than reported results for surface initiated IID wherein the concentration of Si impurity in the disordered material is lower and the impurity diffusion process is likely delayed at initial introduction at the surface of the sample. To be noted is that large concentrations of Si increase the diffusion constant and minimize the sensitivity of diffusion to differences in crystal parameters, such as the percentage of Al present in the heterostructure layers. Thus, the presence of overabundant quantities of the impurity increases the reliability of predetermining in a predictable manner the depth and lateral extent of EBILD disordering accomplished in the crystal bulk.

Thus, recaping some of the previous advantages over surface initiated IID, the use of a laser scanning system to incorporate an impurity, such as Si, present in high concentration in an encapsulation surface layer is threefold. First, the Si impurity does not melt during liquid phase remelt of trace pattern on the sample but rapidly dissolves into the underlying molten disordered alloy. This eliminates the difficulties that could occur at the Si-GaAs interface, for example, during surface initiated IID wherein the Si impurity diffuses at a greater rate laterally along such an interface than into the crystal bulk of the sample. Second, the Si impurity incorporation can be patterned by a direct write process without the need for any photolithographic processing. This capability is important to provide in situ fabrication of integrated optoelectronics circuits within the crystal growth chamber. Third, the required diffusion time is reduced by approximately 4 to 8 hours over standard surface initiated IID, i.e., the final disordering step in the EBILD process is given a head start by provision of an initial disordered alloy/impurity node. In addition, the variation of the depth of disordering via changes to laser power or scan speed or laser spot size will prove useful in fabricating unique integrated devices monolithically requiring different depth levels of disordered regions in semiconductor heterostructures.

Relative to semiconductor laser devices, it is well known that buried heterostructure (BH) quantum well lasers exhibit the lowest threshold current and highest efficiency of any form of solid state diode laser in the present state of the art. However, the EBILD process of this invention is employed to fabricate low threshold (6 mA) BH heterostructure lasers wherein the photolithographic masking required in surface initiated IID is eliminated and the time period of application of subsequent IID thermal annealing is significant reduced thereby reducing possible crystal damaging effects. While the appearance of the laser waveguide is very similar to those possible by surface initiated IID, advantages of the EBILD process include the greatly reduced anneal time required in fabricating the buried heterostructure and is accomplished by a direct write capability in which any line pattern of disordering can easily be generated with small micron scale precision controlled with disordered depth and halfwidth not readily possible with surface initiated IID.

Figure 7A:
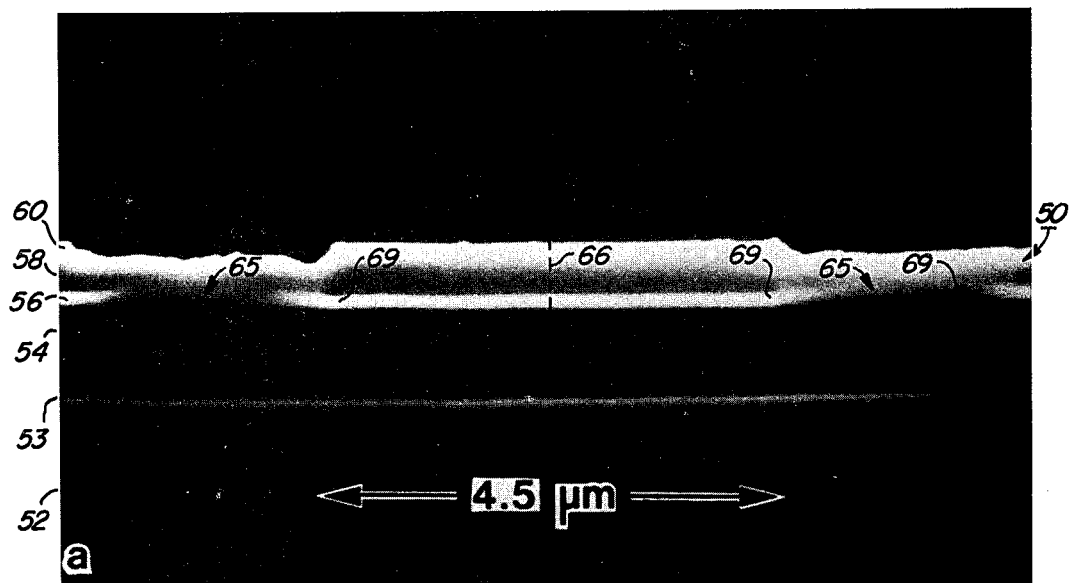
FIG. 7a is a SEM image of the cross section of a buried heterostructure (BH) laser fabricated in accordance with the teachings of this invention.

FIG. 7a is a SEM photograph of the cross section of BH laser fabricated using the EBILD process of this invention. The epitaxial layers of the BH laser formed from sample 50 are grown conventionally via metal organic chemical vapor deposition (MOCVD) and form a separate confinement double heterostructure consisting of a Se-doped GaAs buffer layer 53 approximately 300 nm thick on a GaAs substrate 52, a Se-doped Ga$_{0.15}$Al$_{0.85}$As lower confinement or cladding layer 54 approximately 1.0 μm thick, a stair step quantum well active region 56 comprising a single quantum well of GaAs approximately 10 nm thick within an undoped Al$_{0.25}$Ga$_{0.75}$As waveguide region 55 approximately 150 nm thick, a Mg-doped Al$_{0.85}$Ga$_{0.15}$As upper confinement or cladding layer 58 of approximately 900 nm thick, and a Zn-doped GaAs cap layer 60 of approximately 150 nm thick. Finally, Si (40 nm thick)-Si$_3$N$_4$(90 nm thick) encapsulation surface layers 62 and 64 are deposited by chemical vapor deposition.

After crystal growth, laser beam scanning was applied to provide regions of lower bandgap and higher refractive index to form an optical waveguide and buried active region for lasing action. The scan speed employed was 100 μm/s and incident power at the sample surface was approximately 200 mW. This power level was adjusted in order that the melted, recrystallized region 66 would be approximately 1.0 μm deep by approximately 1.8 μm wide. For producing single stripe BH laser devices, the scan pattern comprises line pairs of disordered regions 65 intermixed with Si, with each disordered line separated from one another by 8 μm and positioned on 20 mil centers. Although the laser induced liquid phase regrowth disorders the crystal heterostructure sample 50 down to active region 56, a subsequent thermal anneal at 850° C. for a period of 0.7 hour extended disordered regions 65 through active region 56 to create waveguide structure 66 shown in FIG. 7 between these regions.

To improve the electrical characteristics of laser 50, Zn is diffused into upper confining layer 58. After diffusion, thick photoresist is used to selectively protect the surface of the waveguide region 66 between the scan regions 60. A subsequent proton bombardment (PBB) into region 68 in FIG. 7b effectively restricts the current injection to waveguide region 66. The sample 50 is then processed in a conventional manner into discrete laser devices 10 mils long by 20 mils wide.

The waveguide region 66 formed by the disordered regions 65 in FIG. 7a is approximately 4.5 $\mu$m wide waveguide. The disordered regions 65 of $Ga_{1-x'}Al_{x'}As$, have a molar fraction x' of now approximately 0.7 and exhibit a fairly sharp transition at the disordered/as-grown boundary 69 of about 100 nm. The decrease in index of refraction and increase in bandgap of the disordered regions 65 provide the lateral optical and carrier confinement required for BH laser operation.

Figure 7B:
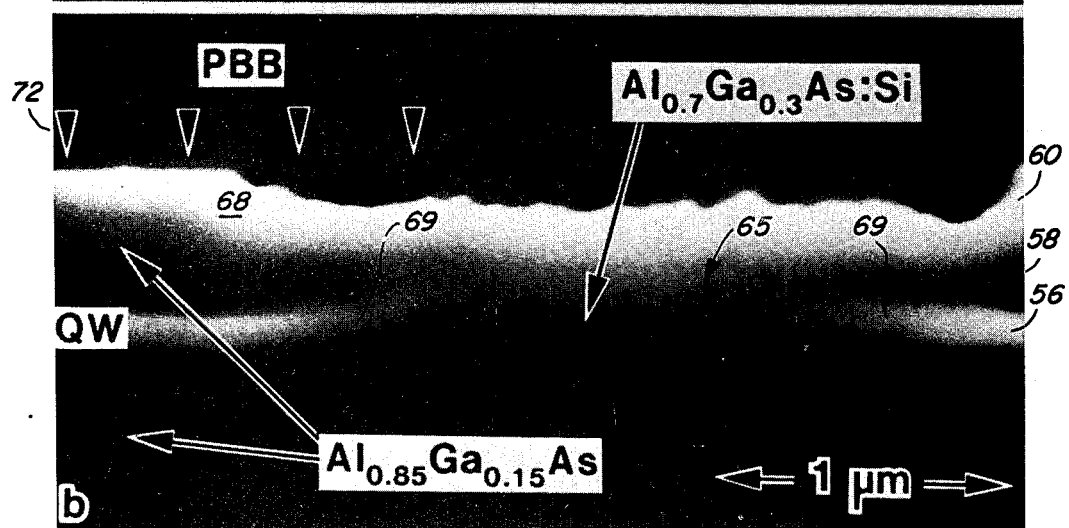

FIG. 7b is a magnified view of FIG. 7a of the disordered region 65 to the left of waveguide 66. The proton bombardment (PBB) is indicated by arrows 72 and is applied to regions adjacent to waveguide 66 to effectively block the current in these regions and confine the current to waveguide 66.

Figure 8:
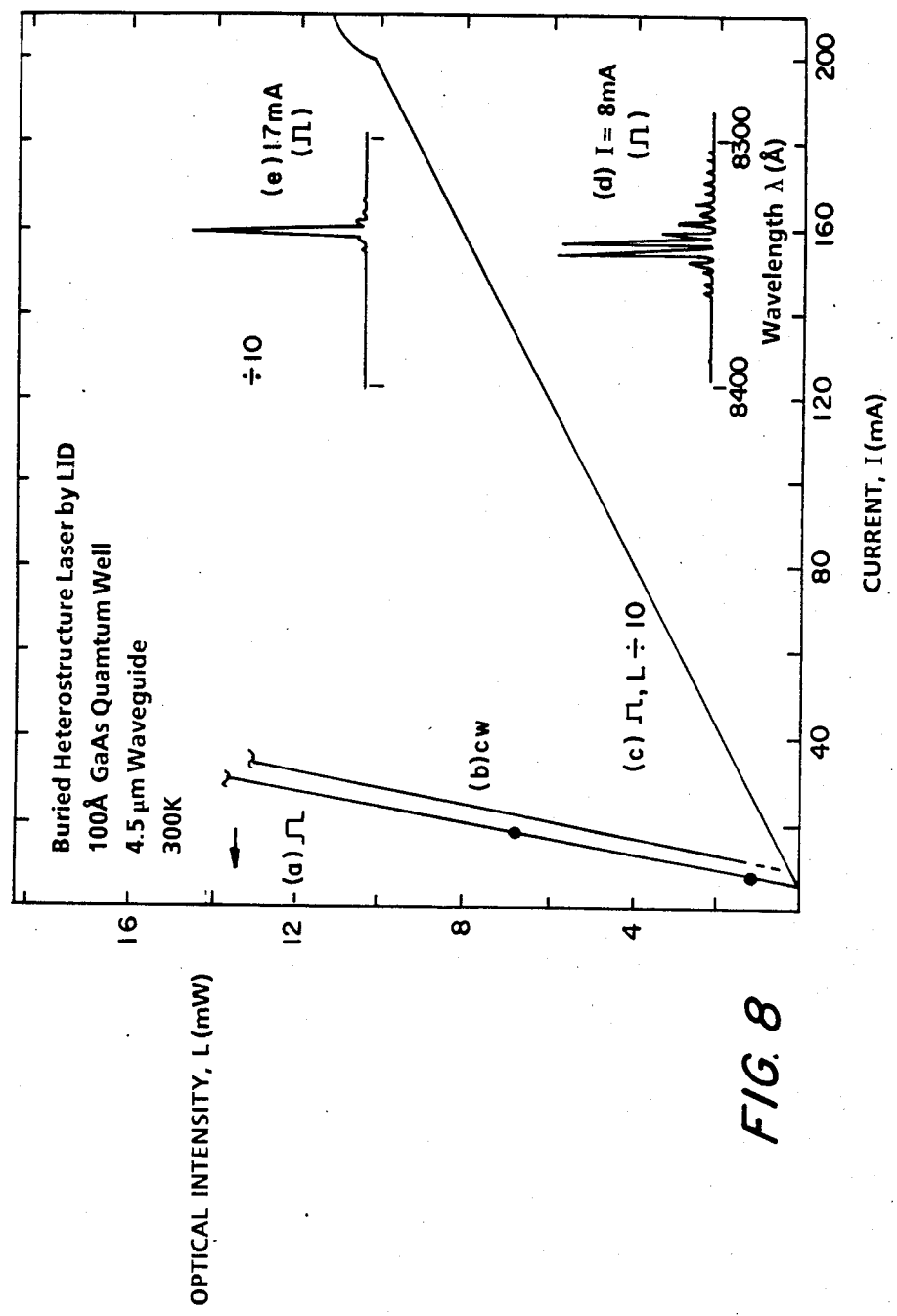
FIG. 8 is a graphic illustration of the optical power versus injection current exhibited upon operation of a buried heterostructure (BH) laser having the structure shown in FIG. 6.

The light versus current characteristics for two fabricated BH laser devices are shown in FIG. 8 along with spectral data. Curve a in FIG. 8 is an L-I curve for pulsed current conditions and illustrates that the threshold current, $I_{th}$, of a tested device is about 6.2 mA. Curve b in FIG. 8 is an L-I curve for cw current conditions. The cw threshold current is 8.5 mA and the maximum cw output power is above 20mW. Curve c in FIG. 8 is an L-I curve for pulsed current conditions and is from the same BL laser device as the data for curve a. However, the optical output is reduced by a factor of 10 to demonstrate that operation at high peak currents is possible. To be noted is that this BH laser device operates at a pulsed current level of over thirty-three times current threshold and has a maximum power output of over 110 mW. The linear slope indicates good carrier confinement in active region 56.

In FIG. 8, spectra data is shown at two levels of current pulses. At 8 mA in the spectrum shown at d, the BH laser device operates with several evenly spaced longitudinal modes, while at 25 mA in the spectrum shown at e, the device operates in single longitudinal mode. The single longitudinal mode operation at d is characteristic of index guided lasers.

Figure 9:
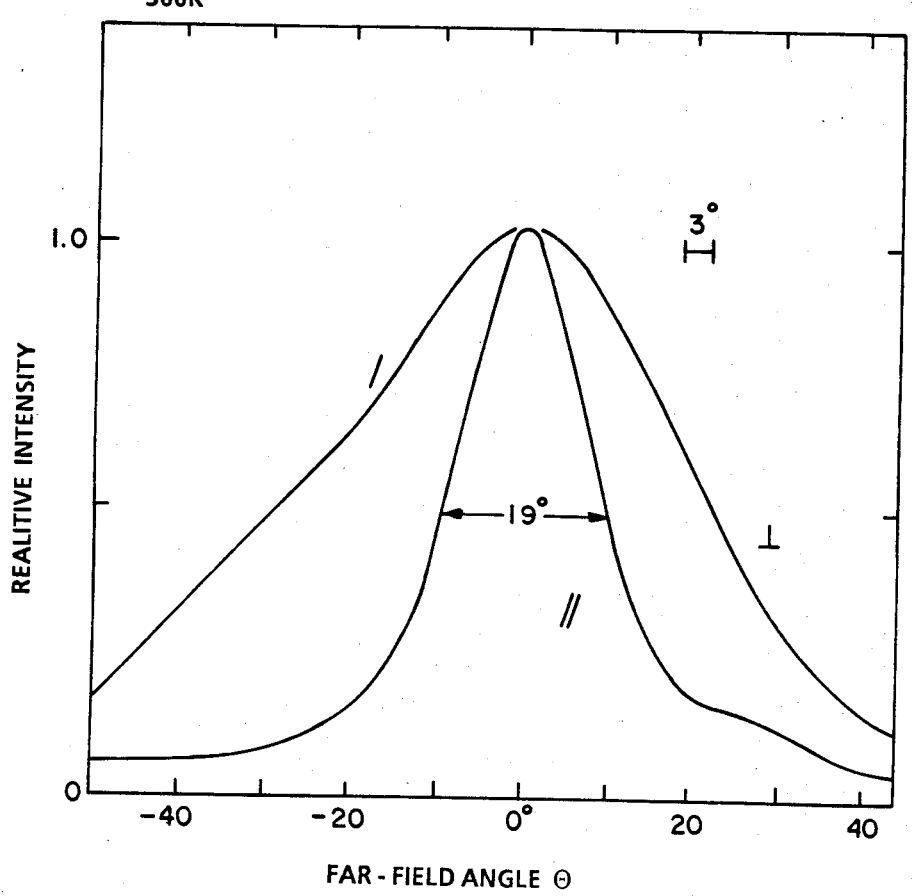
FIG. 9 is the far field radiation pattern for a buried heterostructure (BH) laser having the structure shown in FIG. 6.

In FIG. 9, the far field pattern for a BH laser of the type illustrated in FIG. 7a is shown at a cw operation with an injection current of 20 mA. The far field pattern, both parallel (curve a) and perpendicular (curve b) to the p-n junction, is fairly smooth and featureless indicative of lasing operation in a single transverse and lateral mode which is further supported by visual observation of the far field with an infrared viewer. The full angle at half maximum of 19° for curve a indicates an emitter width of approximately 3 $\mu$m, which is in reasonable agreement with a 4.5-$\mu$m wide waveguide 66.

Figure 10:
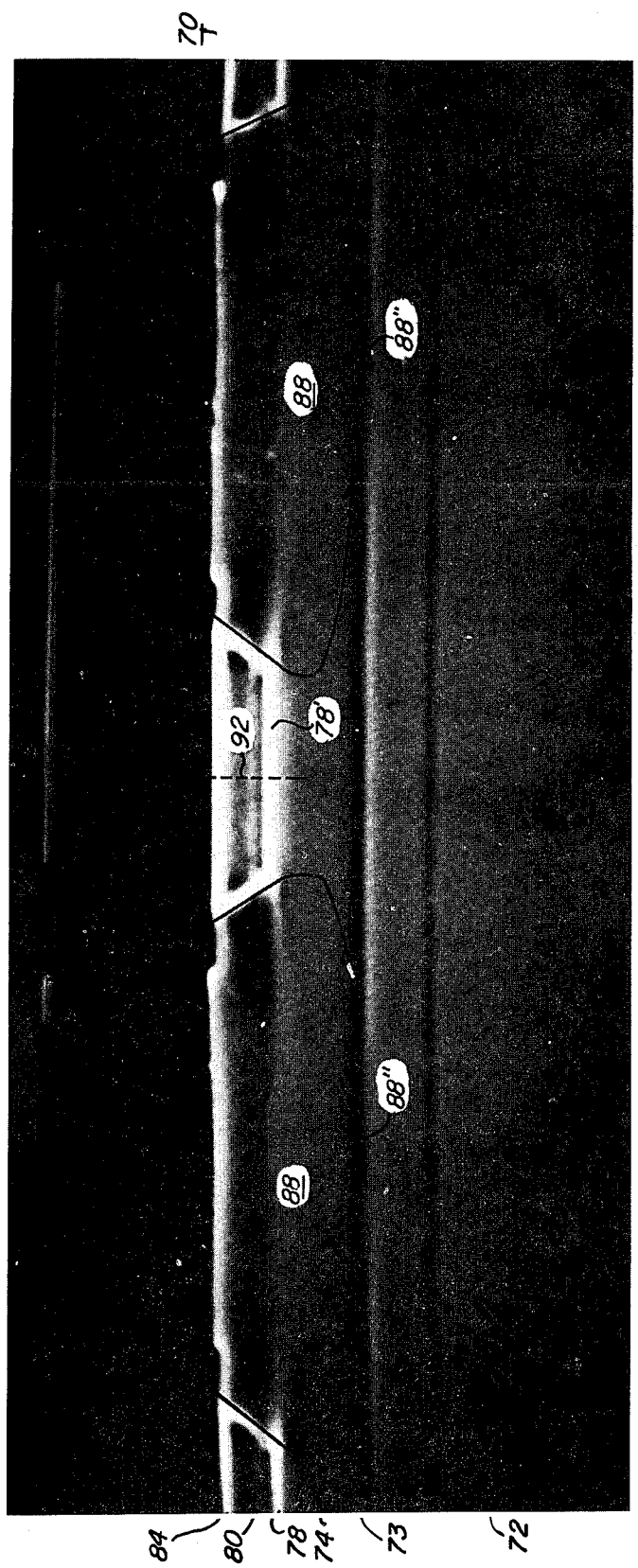
FIG. 10 is a SEM image of the cross section of another buried heterostructure (BH) laser fabricated in accordance with the teachings of this invention and illustrating the anisotropic nature upon IID processing.

Reference is now made to FIGS. 10–12 wherein there is shown another BH laser structure 70 processed according to the teachings of this invention and characterized by anisotropic styled disordered regions to form the waveguide and carrier injection region for lasing action formed between pairs of such regions. Laser structure 70 may be a multi emitter laser wherein only four emitters 96 are shown. As illustrated in FIG. 11, BH laser 70 comprises a GaAs substrate 72 upon which there is deposited via conventional MOCVD, the following layers: a thin buffer layer 73 of n-GaAs, a n doped $Ga_{1-x}Al_xAs$ cladding layer 74 wherein x may be, for example, 0.85, an undoped quantum well region 78 of GaAs, a p doped $Ga_{1-x}Al_xAs$ cladding layer 80 wherein x may be, for example, 0.85, and cap layer 82 of P+ GaAs. As previously indicated relative to FIG. 3, active region 78 may take on various forms including multiple layers. A layer 84 of $Si_3N_4$ is then evaporated upon cap layer 82. The use of the $Si_3N_4$ compound as the impurity encapsulation layer vis a vis Si per se provides for a less amount of Si incorporation and, in turn, provides the anisotropic effect in the undoped and n-type doped layers of BH laser structure 70, particularly the n doped regions. This is because Si as a disordering impurity moves through n doped regions at a faster rate compared to p doped regions. As an example, cladding layers 74 and 80 are approximately 900 nm thick, waveguide layer is 50 nm thick and active region 78 is 1 nm thick.

The bloated shape disordered regions 88 shown in FIG. 12 are formed using the EBILD process of this invention. First, using the apparatus in FIG. 1, a beam 14, under computer control, is focused to selectively disorder spatial and parallel regions 88A shown in FIG. 11. The scanning rate may be 100 $\mu$/sec. The heat from the beam converts a portion of cap layers 82 and cladding layer 80 into its liquid phase, intermixing the compound and alloy of these layers as well as intermixing Si into region 88A. Very little Si need be released from the Si layer 82, e.g., on the order of one to two Si monolayers. It is believed that the $Si_3N_4$ is decomposed and the nitrogen is released in the gas phase.

The extent of disordering is noted by the disordered-/as-grown boundary 88'. Regions 88A function as a seed for further processing to extend boundary 88' further into the crystal bulk. Laser structure 70 is subjected to an anneal at 850° C. for about an hour, enlarging regions 88A to take the form of disordered regions 88 shown in FIG. 12. This extension of boundary 88' to a new boundary 88" is caused by the diffusion of Si intermixed in regions 88A into adjacent areas of the crystal. The extension of boundaries 88' are greater in proportion in areas indicated at 90 because the Si impurity will diffuse faster in undoped in p doped materials compared to n doped materials. Advantage is taken of this phenomenon to form the waveguide regions 92 between disordered portions 90 forming the buried short active region segments 78' of active layer 78. In this manner, waveguides 92 are formed because disordered regions 88 are now of wider bandgap and lower refractive index compared to comparable portions in waveguide regions 92.

Upon removal of $Si_3N_4$ layer 84, laser structure 70 is completed by formation of the proton implant regions 94 for confining pumping current to waveguide regions 92 and the evaporation of conventional pumping contacts 85 and 86. The emitting regions of multi emitter laser 70 are illustrated at emitters 96.

Disordered regions 88 in FIGS. 10 and 12 comprise substantially homogeneous $Ga_{1-x'}Al_{x'}As/Si$ wherein x is approximately 0.65 and Si concentration is $10^{20}$ atoms/cm$^3$. Of particular note again is that disordered regions 88 at their bottom opposite ends 90 have migrated anisotropically, in particular, laterally during IID processing. This anisotropic action is highly desirable since it forms restricted waveguide regions at 92.

FIG. 10 shows the BH laser structure 70 just after completion of EBILD processing and, therefore, is comparable with FIG. 12. The light lines in FIG. 10 at 77 are active region 78 and light line 83 across the top of the structure is impurity encapsulation surface layer 84 which is later removed by etching followed by the formation of contact 85. To be noted in FIG. 10 is that disordered regions 88 are shown at outline 89.

The concentration of the impurity to be incorporated into the crystal structure can be selected by the type of encapsulation layer employed. For example, a $Si_3N_4$ encapsulation layer provides an intermediate concentration of about $10^{19}$ atoms/cm$^3$, which is of sufficiently reduced concentration to provide a greater inhibition for Si diffusion in a p type GaAlAs as compared to n type GaAlAs. The resultant effect is anisotropic in nature, as shown in FIG. 10 wherein the disordered regions 88 are more laterally extensive in the p type cladding layer 74 of laser 70.

The two step of three step process of this invention may also be used exclusively for the incorporation of impurity to change the resistivity of a region of a semiconductor structure. For example, longitudinal or traverse portions of a semiconductor layer or layers can be epitaxially deposited without a dopant forming high electrical resistance regions. An impurity may then be patterned into selected regions of the layer by energy beam disordering and the region disordered further enlarged to a predetermined extent by subsequent IID treatment. The disordered regions treated will have a higher conductivity compared to adjacent regions so that a patterned current confinement path would be created through and in these treated regions.

Figure 13:
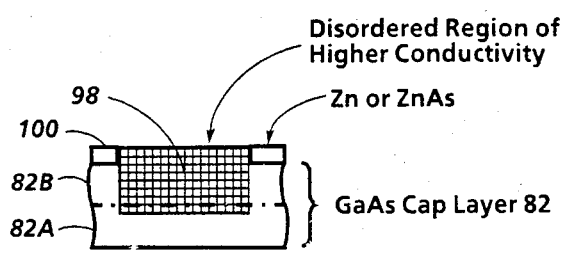
FIG. 13 is an enlarged view taken from a portion of FIG. 12.

A specific example of the foregoing application is in connection with cap layer 82 in FIG. 12. As an example, in FIG. 13, the lower portion 82A of layer 82 for its full extent may be doped p+ while the upper portion 82B thereof would remain undoped. This is accomplished by turning off the p type dopant supply to the MOCVD reactor during the growth of layer portion 82B. After all other processing after removal of the $Si_3N_4$ layer 84 but before proton implant 94, an impurity encapsulation layer 100 of p type impurity or compound thereof is deposited over at regions of waveguide 92 and a shallow, selective beam scan is accomplished to intermix via liquid phase the p type impurity with at least a portion if not all of undoped portion 82B of cap layer 82 forming doped regions 98 of higher electrical conductivity compared to adjacent regions not scanned by beam 14. The shallow disordering may be extended further into layer 82 and waveguide 92 by subsequent IID. Thus, the method of this invention may be employed to form current confinement channels for a desired length of the waveguide regions 92. The solid phase p type impurities are Zn or Mg. As illustrated in FIG. 13, Zn or ZnAs, for example, may be deposited prior to EBILD treatment.

In conclusion, the EBILD process disclosed provides for fabricating high quality optoelectronic devices. The ability to selectively disorder GaAlAs-GaAs crystal layers in a desired pattern in the heterostructure sample in a controllable manner opens up new possibilities for device fabrication and integration. A computer controlled scanning table with a focused energy beam, such as an Ar+ laser beam, is used as a localized heat source capable of disordering GaAlAs crystal layers on a micron scale in a desired pattern. The melting and regrowth process upon this beam application occurs smoothly and is controlled by monitoring or making changes to the laser power level, or to the scan speed, or to the laser spot size. The transition between disordered and as-grown crystal is sharp and regular, and, at low power levels, there is no evidence of serious crystal damage. In addition, Si impurity present in the surface layer is incorporated into the regrown crystal and participates in subsequent disordering if the sample is thereafter annealed. Thus, the EBILD process is capable of directly writing patterns for subsequent IID. The BH lasers fabricated using this method exhibit a low current threshold, high current handling capability, and single mode operation over a limited current range.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method of selectively converting regions of a semiconductor structure into a disordered alloy exhibiting different bandgap and refractive index properties comprising the steps of:
    (a) providing a single crystal semiconductor heterostructure having at least two heterogeneous layers of different constituents,
    (b) scanning said heterostructure with an energy beam to selectively transform at least a portion of said layers into a liquid phase intermixing said constituents to form a disordered homogeneous alloy in selected regions of said layers scanned by said beam, said selected regions having different bandgap and refractive index properties compared to regions of said layers not scanned by said beam.

2. The method of claim 1 which includes the step of thermal annealing said heterostructure to extend said selected disordered homogeneous alloy regions further into said heterostructure.

3. The method of claim 1 which includes the step of heating said heterostructure during scanning to a background temperature just below the temperature required to achieve rapid thermal disordering of said structure.

4. The method of claim 1 wherein said energy beam comprises a laser beam or an electron beam or an ion beam or acoustic beam or combination thereof.

5. The method of claim 1 wherein said heterostructure layers each comprise an elemental constituent, a compound or an alloy.

6. The method of claim 1 wherein said heterostructure comprises II-VI compounds or alloys.

7. The method of claim 1 wherein said heterostructure includes a well feature comprising a single quantum well structure, a multiple quantum well structure of a separate confinement single or multiple quantum well structure.

8. The method of claim 2 wherein the step of said annealing is in the temperature range of 800° C. to 900° C.

9. The method of claim 3 wherein the step of background heating is in the temperature range of 600° C. to 1000° C.

10. The method of claim 7 wherein said well feature comprises a quantum well structure having well layer(s) selected from the group consisting of GaAs and $Ga_{1-x}Al_xAs$ and barrier layer(s) selected from the group consisting of AlAs and $Ga_{1-y}Al_yAs$ where $y > x$.

11. A method of selectively converting regions of a semiconductor structure into a disordered alloy exhibiting different bandgap and refractive index properties comprising the steps of:
(a) providing a single crystal semiconductor heterostructure having at least two as-grown heterogeneous regions of different constituents.
(b) providing an impurity encapsulation surface layer on said heterostructure having a high concentration of an impurity species.
(c) converting a portion of said heterogeneous regions into their liquid phase via a scanned energy beam forming a liquid melt with intermixing of said region constituents and concurrently incorporating said impurity species from said impurity encapsulation surface layer into said melt in a concentration equal to the liquid solubility of the impurity in a disordered alloy produced via said intermixing, said disordered alloy forming a boundary with said as-grown regions upon cooling.

12. The method of claim 11 which includes the step of thermal disordering said heterostructure and extending said boundary further into said structure by the diffusion of said impurity species from said disordered alloy into adjacent as-grown regions of said heterostructure.

13. The method of claim 11 wherein said source of disordering material consists substantially of a disordering impurity.

14. The method of claim 11 wherein said source has a disordering material concentration in the range of $10^{18}$ atoms/cm$^3$ to $10^{21}$ atoms/cm$^3$.

15. The method of claim 11 wherein the step of said annealing is in the temperature range of 800° C. to 900° C.

16. The method of claim 11 which includes the step of heating said heterostructure during scanning to a background temperature just below the temperature required to achieve rapid thermal disordering of said well feature.

17. The method of claim 11 which includes the step of removing said source encapsulated layer, depositing a different source encapsulated layer and again scanning said heterostructure with an energy beam to selectively transform at least a portion of said layers into a liquid phase forming a disordered alloy in selected portions scanned by said beam thereby converting said selected regions into a homogeneous region having different bandgap and refractive index properties compared to regions of said layers not scanned by said beam.

18. The method of claim 11 wherein said energy beam comprises a laser beam or an electron beam or an ion beam or an acoustic beam or combination thereof.

19. The method of claim 11 wherein said disordering material is selected from the group consisting of B, N, C, Al, SI, P, Ga, As, In, Sb, Hg, Pb, Bi, Ge, Se, Mg, O, S, Be, Te, Si, Mn, Zn, Cd, Sn, Cr and V.

20. The method of claim 11 wherein said heterostructure comprises II-VI compounds or alloys.

21. The method of claim 11 wherein said heterostructure includes a well feature comprising a single quantum well structure, a multiple quantum well structure or a separate confinement single or multiple quantum well structure.

22. The method of claim 11 which includes the steps of determining the depth and lateral width of said disordered alloy boundary in said structure by controlling the level of energy beam power and the rate of scanning of said energy beam.

23. The method of claim 16 wherein the step of background heating is in the temperature range of 600° C. to 1000° C.

24. The method of claim 21 wherein said well feature comprises a quantum well structure having well layers(s) selected from the group consisting of GaAs and $Ga_{1-x}Al_xAs$ and barrier layer(s) selected from the group consisting of AlAs and $Ga_{1-y}Al_yAs$ where $y > x$.

25. The method of claim 24 wherein said disordering material is selected from the group consisting of Ge, Se, Mg, O, S, Be, Te, Si, Mn, Zn, Cd, Sn, Cr and V.

26. A method of selectively converting regions of a semiconductor structure to have different electrical conductivity properties comprising the steps of:
(a) providing a single crystal semiconductor heterostructure having at least two as-grown heterogeneous regions of different constituents.
(b) providing an impurity encapsulation surface layer on said heterostructure having a high concentration of an impurity species,
(c) scanning said heterostructure with an energy beam to selectively pattern and transform at least a portion of said regions into its liquid phase and intermixing said purity in melted portions of said regions scanned by said beam thereby converting said portions into a homogeneous region of disordered alloy having different electrical conductivity properties compared to regions not scanned by said beam, said disordered alloy forming a boundary with said as-grown regions upon recrystallization thereof.

27. The method of claim 26 which further includes the step of annealing said heterostructure to disorder additional portions of said as-grown regions beyond said boundary, the impurity incorporated in said recrystalized homogeneous region functioning as an impurity source for the disordering process.

28. The method of claim 26 wherein said impurity is selected from the group consisting of B, N, C, Al, SI, P, Ga, As, In, Sb, Hg, Pb, Bi, Ge, Se, Mg, O, S, Be, Te, SI, Mn, Zn, Cd, Sn, Cr and V.

29. The method of claim 26 wherein said heterostructure comprises II-VI compounds or alloys.

30. The method of claim 26 wherein said heterostructure includes a well feature comprising a single quantum well structure, a multiple quantum well structure or a separate confinement single or multiple quantum well structure.

31. The method of claim 30 wherein said well feature comprises a quantum well structure having well layer(s) selected from the group consisting of GaAs and $Ga_{1-x}Al_xAs$ and barrier layer(s) selected from the group consisting of AlAs and $Ga_{1-y}Al_yAs$ where $y > x$.

32. The method of claim 31 wherein said impurity is selected from the group consisting of Ge, Se, Mg, O, S, Be, Te, Si, Mn, Zn, Cd, Sn, Cr and V.

33. A method of fabricating a crystalline semiconductor structure via a direct write technique comprising the steps of:

(a) providing a crystalline semiconductor structure having at least first and second layers of heterogeneous material, (b) forming a third surface layer relative to said first and second layers containing an impurity in elemental form or as a compound constituent, (c) selectively melting regions at least a portion of said first and second layers by applying the output of an energy beam thereto in a scanned pattern and intermixing therein said impurity, the temperature of said beam not exceeding the melting temperature of said impurity.

(d) permitting sai melted regions to recrystallize forming an impurity incorporated, homogeneous alloy.

34. The method of claim 33 wherein said impurity is selected from the group consisting of B, N, C, Al, SI, P, Ga, As, In, Sb, Hg, Pb, Bi, Ge, Se, Mg, O, S, Be, Te, Si, Mn, Zn, Cd, Sn, Cr and V.

35. The method of claim 33 wherein said third layer has an impurity concentratio in the range of $10^{18}$ atoms/cm$^3$ to $10^{21}$ atoms/cm$^3$.

36. The method of claim 33 wherein said surface layer is formed by evaporation.

37. The method of claim 33 wherein said surface layer is a compound including said impurity.

38. The method of claim 33 wherein said impurity is deposited in clusters distributed in said layers.

39. A method of fabricating a crystalline semiconductor structure via a direct write technique comprising the steps of:

(a) epitaxially depositing a crystalline semiconductor structure having at least first and second layers of heterogeneous material, (b) forming a plurality of concentrated clusters of an impurity dispersed throughout the upper portion of said second layer during the epitaxial growth thereof, (c) melting selected regions of said layers by applying the output of an energy beam thereto in a scanned pattern causing said impurity to intermix into the melted regions of said layers, (d) permitting said melted regions to recrystallize forming an alloy comprising the constituents of said first and second layers.

40. The method of claim 39 which includes the step of annealing said structure to extend the propagation of said alloy region further into said structure.

41. The method of claim 39 wherein said impurity is selected from the group consisting of B, N, C, Al, SI, P, Ga, As, In, Sb, Hg, Pb, Bi, Ge, Se, Mg, O, S, Be, Te, Si, Mn, Zn, Cd, Sn, Cr and V.

42. The method of claim 39 wherein said heterostructure comprises II-VI compounds or alloys.

43. The method of claim 39 wherein said heterostructure includes a well feature comprising a single quantum well structure, a multiple quantum well structure or a separate confinement single or multiple quantum well structure.

44. The method of claim 39 wherein said impurity in said second layer has a concentration in the range of $10^{18}$ to $10^{21}$ atoms/cm$^3$.

45. The method of claim 43 wherein said well feature comprises a quantum well structure having well layer(s) selected from the group consisting of GaAs and $Ga_{1-x}Al_xAs$ and barrier layer(s) selected from the group consisting of AlAs and $Ga_{1-y}Al_yAs$ where $y>x$.

46. The method of claim 45 whrein said impurity is selected from the group consisting of Ge, Se, Mg, O, S, Be, Te, Si, Mn, Zn, Cd, Sn, Cr and V.

47. A method of selective induced disordering comprising the steps of:

(a) providing a semiconductor crystalline heterostructure comprising at least two heterogeneous layers consisting of different elemental constituents and/or elemental constituents of different percentages by weight, (b) scanning said heterostructure in a pattern with an energy beam to selectively melt transverse regions of said layers scanned by said beam intermixing the elemental constituents in said layers to form a resultant homogeneous patterned region, (c) permitting said patterned regions to recrystallize forming an alloy comprising the constituents of said first and second layers.

48. The method of claim 47 which includes the step of annealing said heterostructure to extend the propagation of said alloy patterned regions further into said heterostructure.

49. The method of claim 47 wherein said energy beam comprises a laser beam or an electron beam or an ion beam or an acoustic beam or combination thereof.

50. The method of claim 48 wherein the step of said annealing is in the temperature range of 800° C. to 900° C.

51. A method of selective energy beam impurity disordering comprising the steps of:

(a) providing a semiconductor heterostructure at least two heterogeneous layers, (b) depositing a source of disordering material in solid phase from one said heterostructure, (c) scanning said heterostructure with an energy beam to selectively transform selected portions of said heterogeneous layers in proximity to said source into their liquid phase forming a disordered homogeneous alloy incorporating said disordering material upon solidification thereof.

52. The method of claim 51 which includes the step of annealing said heterostructure to cause the migration of said incorporated disordering material beyond said selected portions further into said heterostructure to increase the extent of said disordered alloy into said layers via their solid phase.

53. The method of claim 51 wherein source of disordering material consists substantially of a disordering impurity.

54. The method of claim 51 wherein said source has a disordering material concentration in the range of $10^{18}$ atoms/cm$^3$ to $10^{21}$ atoms/cm$^3$.

55. The method of claim 51 wherein said disordering material is selected from the group consisting of B, N, C, Al, SI, P, Ga, As, In, Sb, Hg, Pb, Bi, Ge, Se, Mg, O, S, Be, Te, Si, Mn, Zn, Cd, Sn, Cr and V.

56. The method of claim 51 wherein said energy beam comprises a laser beam or an electron beam or an ion beam or an acoustic or combination thereof.

57. The method of claim 52 wherein said migration is anisotropic.

58. The method of claim 52 wherein said migration is isotropic.

* * * * *